US008717807B2

(12) United States Patent
Chuang et al.

(10) Patent No.: US 8,717,807 B2
(45) Date of Patent: May 6, 2014

(54) INDEPENDENTLY-CONTROLLED-GATE SRAM

(75) Inventors: Ching-Te Chuang, New Taipei (TW); Yin-Nien Chen, Hinchu (TW); Chien-Yu Hsieh, Hsinchu (TW); Ming-Long Fan, Taichung (TW); Pi-Ho Hu, Hsinchu (TW); Pin Su, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 297 days.

(21) Appl. No.: 13/419,291

(22) Filed: Mar. 13, 2012

(65) Prior Publication Data
US 2013/0100731 A1    Apr. 25, 2013

(30) Foreign Application Priority Data

Oct. 21, 2011    (TW) .............................. 100138258 A

(51) Int. Cl.
*G11C 11/00*    (2006.01)
(52) U.S. Cl.
USPC ....... 365/154; 365/174; 365/188; 365/189.15
(58) Field of Classification Search
USPC .............................. 365/154, 174, 188, 189.15
See application file for complete search history.

(56) References Cited

U.S. PATENT DOCUMENTS

| 7,382,162 | B2 | 6/2008 | Chiang |
| 7,532,501 | B2 | 5/2009 | Joshi |
| 8,072,798 | B2* | 12/2011 | Takeyama ..................... 365/154 |
| 2013/0141962 | A1* | 6/2013 | Liaw ............................. 365/154 |

OTHER PUBLICATIONS

Chiang et al., "High-Density Reduced-Stack Logic Circuit Techniques Using Independent-Gate Controlled Double-Gate Devices," IEEE Transactions on Electron Devices, vol. 53, No. 9, Sep. 2006, pp. 2370-2377.
Kanj et al., "Statistical Evaluation of Split Gate Opportunities for Improved 8T/6T Column-decoupled SRAM Cell Yield," 9th International Symposium on Quality Electronic Design, Mar. 17-19, 2008, pp. 702-707.
Chang et al., "Stable SRAM Cell Design for the 32 nm Node and Beyond," Symposium on VLSI Technology, Digest of Technical Papers, Jun. 14-16, 2005, pp. 128-129.
Chen et al., "Disturb-Free Independently-Controlled-Gate 7T FinFET SRAM Cell," International Symposium on VLSI Technology, Systems and Applications, Apr. 25, 2011, pp. 1-2.

* cited by examiner

*Primary Examiner* — Vu Le
*Assistant Examiner* — Han Yang
(74) *Attorney, Agent, or Firm* — Muncy, Geissler, Olds & Lowe, P.C.

(57) ABSTRACT

The present invention provides an IG 7T FinFET SRAM, which adopts independently-controlled-gate super-high-$V_T$ FinFETs to achieve a stacking-like property, whereby to eliminate the read disturb and half-select disturb. Further, the present invention uses keeper circuits and read control voltage to reduce leakage current of the bit lines during read. Furthermore, the present invention can effectively overcome the problem of the conventional 6T SRAM that is likely to have read errors at low operation voltage.

10 Claims, 4 Drawing Sheets

INDEPENDENTLY-CONTROLLED-GATE SRAM

BACKGROUND OF THE INVENTION

1. Field of the Invention

The present invention relates to a SRAM, particularly to a disturb-free independently-controlled-gate FinFET SRAM.

2. Description of the Related Art

Memories, such as SRAM, are embedded in consumer electronics, communication electronics, microprocessors and various hardwares to store data. In the semiconductor industry, since the scaling of CMOS has reached the physical limit as the feature size reduced down to 20 nm, FinFET (Fin-based Field Effect Transistor) with the superiority gate-control, better SCE (short-channel-effect), $I_{on}/I_{off}$ ratio, subthreshold swing and RDF (Random Dopant Fluctuation) immunity has been proposed as the promising candidates for future generation memory devices. Among the embedded memories, SRAM (Static Random Access Memory) plays the most important role and occupies the highest proportion, thus by using FinFET-based SRAM can greatly reduce the size of IC chips and effectively decrease the power consumption of each logic gate.

Refer to FIG. 1, it shows a conventional 6T SRAM which comprises a plurality of memory cells and here is exemplified by the 6T SRAM device containing four memory cells 10a, 10b, 10c and 10d, all of which have an identical structure. The memory cell 10a is used to exemplify the abovementioned memory cells. The memory cell 10a has a first inverter 12, a second inverter 14, a first access transistor 28 and a second access transistor 30, wherein the first and second inverters 12 and 14 are cross coupled. The storage node 16 of the first inverter 12 is directly connected to the gates of a P-type transistor 18 and an N-type transistor 20 of the second inverter 14. The storage node 22 of the second inverter 14 is directly connected to the gates of a P-type transistor 24 and an N-type transistor 26 of the first inverter 12. The source of the N-type transistor 26 of the first inverter 12 is grounded. The source of the P-type transistor 24 of the first inverter 12 is connected to a voltage supply Vcs of the memory cell. The source of the N-type transistor 20 of the second inverter 14 is grounded. The source of the P-type transistor 18 of the second inverter 14 is connected to the voltage supply Vcs of the memory cell. There are at least two word lines, such as WL1 and WL2, connected to the cells in the horizontal row direction. For example, WL1 is connected with the first access transistors 28 and the second access transistors 30 of the memory cells 10a, 10b and cells arranged in the same horizontal row direction. WL2 is connected with the first access transistors 28 and the second access transistors 30 of the memory cells 10c, 10d and cells arranged in the same horizontal row direction. In writing data into or reading data from the storage node 16 of the first inverter 12, WL1 or WL2 is turned on to control the first access transistor 28 to enable write or read. The first access transistor 28 is connected to the bit line BL1 or BL2. In writing data into or reading data from the storage node 22 of the first inverter 14, WL1 or WL2 is turned on to control the second access transistor 30 to enable write or read. The second access transistor 30 is connected to the complementary bit line BR1 or BR2. The first and second access transistors 28 and 30 are controlled by a common word line WL1 or WL2. Below, the memory cell 10a is used as an example to explain the read/write behavior of a memory cell. Before read/write the memory cell 10a, BL1 and BR1 are pre-charged to a high voltage level "1". When read/write the memory cell 10a, BL1 and BR1 are floating. Assume the data stored in the storage node 16 of the first inverter 12 is "0" and the data stored in the storage node 22 of the second inverter 14 is "1". WL1 simultaneously turns on the first and second access transistors 28 and 30, thus via the discharging path of the N-type transistor 26 of the first inverter 12, BL1 is successfully discharged to ground, and meanwhile, BR1 is maintained at a high-level voltage, and the data is successfully read. However, the conventional 6T SRAM cell has two critical problems during read: First, the "half-select" problem, as WL1 simultaneously turns on the memory cells 10a, 10b, and cells arranged in the same horizontal row, there is current flowing in the memory cell 10b of which data is not read, and cause the bit line adjacent to the node stored "0" discharged or even flip the data; the flipped data causes a read error when the memory cell 10b is read later. Second, when both the first access transistor 28 and second access transistor 30 of the memory cell 10a are turned on, the first access transistor 28 and the N-type transistor 26 of the first inverter 12 form a voltage-divided path, and cause a "read disturb" voltage on the storage node 16 originally stored data "0". The node voltage of the storage node 16 and the read disturb voltage is likely to exceed the trip voltage of the second inverter 14 at a low operation voltage, and cause the data stored in the second inverter 14 flipped, making a read error.

Refer to FIG. 2, it shows a 6T-column-decoupled SRAM, which was developed to solve the problem of read errors caused by leakage current and read disturb voltage of the abovementioned 6T SRAM operating in low operation voltage. Different to conventional 6T SRAM cell, a bit-select line is added to the memory cells arranged in the same vertical column in 6T-column-decoupled SRAM cell. As shown in FIG. 2, there are two bit-select lines BS1 and BS2. The memory cell 10a is used to exemplify the 6T-column-decoupled SRAM cell.

In 6T-column-decoupled cell, BS1 is connected to the back gates of the first access transistor 28 and the second access transistor 30, and WL1 is connected to the front gates of the first access transistor 28 and the second access transistor 30. During read, only the selected memory cell 10a, its front and back gates of the first access transistor 28 and the second access transistor 30 are turned on, thus solving the "half-select" problem mentioned in the conventional 6T SRAM. Nevertheless, WL1 turns on the front gates of the first access transistor 28 and the second access transistor 30 of the memory cell 10b in the horizontal row (WL1 direction), and BS1 turns on the back gates of the first access transistor 28 and the second access transistor 30 of the memory cell 10c in the vertical column (BS1 direction). The first access transistors 28 and the second access transistors 30 of the unselected memory cells 10b and 10c are only half turned on (i.e. the so-called half-select disturb), thus read behavior is not taken place in the unselected memory cells 10b and 10c. During read, only one of the gate of the first access transistor 28 and the second access transistor 30 of the unselected memory cell 10b in the horizontal row is turned on, thus the half-select disturb of the memory cell 10b can be mitigated compared with the 6T SRAM cell in FIG. 1. However, the scheme of FIG. 2 cannot yet solve the second problem in the scheme of FIG. 1: The read disturb may lower RSNM (Read Static Noise Margin) or even flip the stored data and thus limit the minimum operation voltage. Besides, the leakage current generated by a single turned-on gate would accumulatively discharge the voltage of the bit line BL1 or BL2 and thus causes a read error. In other words, the access transistors of the unselected memory cells in a half-turned on state due to the back gates of the access transistors are turned on, along with the increased number of the memory cells along a bit line, the leakage current generated by the half-turned on transistors may flip the data stored in the selected memory cell and causes a read error. Besides, the more serious process variation and intrinsic device variation faced in scaled devices may further limit the number of the cells arranged along one bit line.

Accordingly, the present invention proposes a disturb-free independently-controlled-gate FinFET SRAM cell to overcome the abovementioned problems.

SUMMARY OF THE INVENTION

The primary purpose of the present invention is to provide an independently-controlled-gate 7T SRAM to replace the conventional 6T SRAM to overcome the half-select disturb, improve RSNM, and solve the problem of read errors.

Another purpose of the present invention is to provide an independently-controlled-gate FinFET SRAM, wherein the storage nodes are separated from the read path to provide "disturb-free" scheme and improved read stability.

A further purpose of the present invention is to provide an independently-controlled-gate FinFET SRAM using FinFET structure which can be used in independently-controlled-gate mode to improve the stability of memory cells and enhance the immunity against intrinsic device variations. Compared to conventional planar CMOS, the independently-controlled-gate FinFET can effectively simplify the layout of SRAM circuit and greatly reduce the area of SRAM, wherefore can be fabricated a high-density SRAM.

To achieve the abovementioned purposes, the present invention proposes an independently-controlled-gate FinFET SRAM, which comprises a memory cell array storing at least one piece of data (each memory cell stores one piece of data), a plurality of first bit lines and second bit lines (BL and BLB), a plurality of read-control lines, a plurality of read-control FinFETs, a plurality of read voltage control lines, and a plurality of keeper circuits. The memory cell array includes a plurality of memory cells. Each memory cell has a first inverter, a second inverter, a first control FinFET, and a second control FinFET, wherein the first and second inverters are cross coupled, and the first control FinFET is connected to the first inverter, and the second control FinFET is connected to the second inverter. Before read, the first and second bit lines are pre-charged to a high-level voltage "1". When read/write the memory cell, BL and BLB are in a floating state. Each first bit line is connected to the first control FinFETs. Each second bit line is connected to the second control FinFETs. Each read-control line is connected to the memory cells in the same horizontal row parallel to the read-control line and supplies a read-voltage to the selected memory cell.

Each read-control FinFET is connected to one memory cell and one second bit line. Each read-control FinFET includes a first control gate connected to a first storage node of the first inverter; a second control gate connected to the corresponding read-control line; a drain connected to the second bit line; and a source. The circuit design of connecting the first control gate to the first storage node of the first inverter is to reduce leakage current, considering various topologies of data storage. Each read voltage control line is connected to the sources, determining the voltage to which the memory cells are connected. For example, when both the first and second control gates are at a high-level voltage, the read-control FinFET is turned on; when the first or second control gate is at a high-level voltage, the read-control FinFET is half turned on; when the memory cell is selected to be read, the read-voltage control line is grounded; when the memory cell is not selected, the read-voltage control line is connected to the voltage of the voltage source, thereby effectively reducing the leakage current. The keeper circuit provides a keeping voltage to compensate the leakage current generated by the half-turned on read-control FinFETs and the voltage loss of the second bit line when the second bit line is at a high-level voltage. The leakage current mentioned above refers to the current resulting from the half-turned on read-control FinFETs connected to the same bit line in the same vertical column direction. Each keeper circuit is connected to the memory cells arranged in the same vertical column. The read-voltage control lines and the keeper circuits can effectively reduce the probability of false-read.

Below, the embodiments are described in detail to make understanding of the purposes, technical contents, characteristics and accomplishments of the present invention easily.

DETAILED DESCRIPTION OF THE INVENTION

Since the scaling of CMOS has reached the physical limit as the feature size reduced down, FinFET (Fin-based Field Effect Transistor) with the superiority gate-control, better SCE (short-channel-effect), $I_{on}/I_{off}$ ratio, subthreshold swing and immunity to RDF (Random Dopant Fluctuation) due to the use of lightly-doped or un-doped Si fin, has been proposed as the promising candidates for future generation memory devices. Accordingly, the present invention proposes an independently-controlled-gate (IG) 7T FinFET SRAM, which uses super-high-$V_T$ FinFETs to achieve a stacking-like property to eliminate read disturb and half-select disturb, also uses the keeper circuits and read voltage control lines to effectively reduce the leakage current from bit lines, and solve the read error problem during read.

Figure 3:
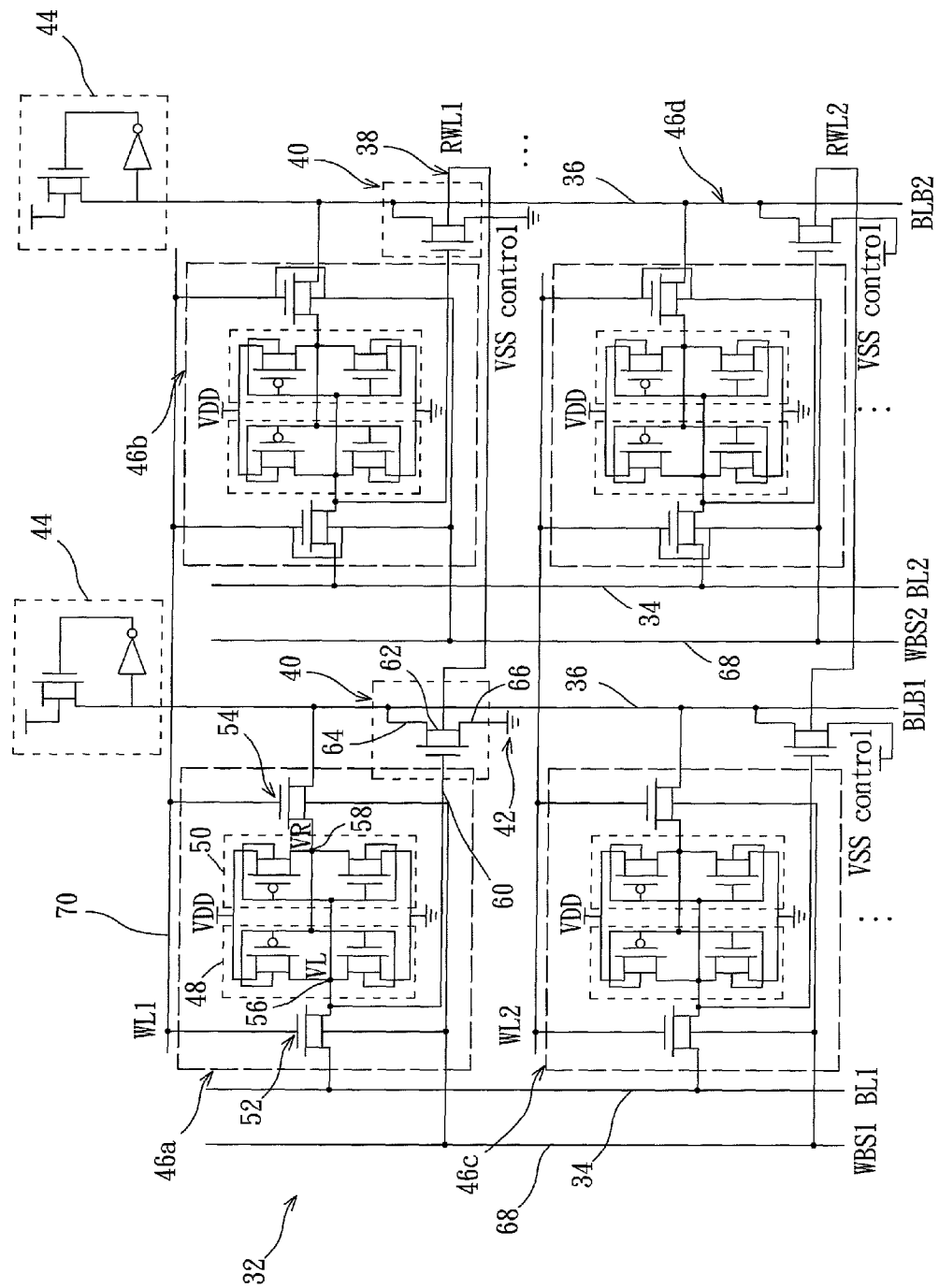
FIG. 3 schematically shows an independently-controlled-gate 7T FinFET SRAM according to one embodiment of the present invention.

Refer to FIG. 3, it schematically shows an independently-controlled-gate 7T FinFET SRAM according to one embodiment of the present invention. The SRAM of the present invention comprises a memory cell array 32, a plurality of first bit lines 34 (such as BL1 and BL2), a plurality of second bit lines 36 (such as BLB1 and BLB2), a plurality of read-control lines 38 (such as RWL1 and RWL2), a plurality of read-control FinFETs 40, a plurality of read voltage control lines 42 (VSS control), and a plurality of keeper circuits 44.

Below, the abovementioned elements and the connection thereof are described in detail to demonstrate the novel circuit design of the present invention. The memory cell array 32 includes a plurality of memory cells. Four memory cells 46a, 46b, 46c and 46d, which all have an identical structure, are used to exemplify the memory cells herein. Each memory cell 46 contains a first inverter 48, a second inverter 50, a first control FinFET 52, and a second control FinFET 54. The first inverter 48 and the second inverter 50 are cross coupled to each other. A first storage node 56 of the first inverter 48 is connected to the drain of the first control FinFET 52. One first bit line 34 (BL1) is connected to the sources of the first control FinFETs 52 of the memory cells 46a and 46c. A second storage node 58 of the second inverter 50 is connected to the drain of the second control FinFET 54. The second bit line 36

(BLB1) is connected to the sources of the second control FinFETs 54 of the memory cells 46a and 46c. Another first bit line 34 (BL2) is connected to the sources of the first control FinFETs 52 of the memory cells 46b and 46d. Another second bit line 36 (BLB2) is connected to the sources of the second control FinFETs 54 of the memory cells 46b and 46d.

The read-control lines 38 are exemplified by two read-control lines RWL1 and RWL2 herein. RWL1 is connected to the memory cells 46a and 46b arranged in an identical horizontal row parallel to RWL1 and supplies a read voltage to the gates of the read control FinFETs 40 of the selected memory cells 46a and 46b. RWL2 is connected to the memory cells 46c and 46d arranged in an identical horizontal row parallel to RWL2 and supplies a read voltage to the gate of the read-control FinFETs 40 of the selected memory cells 46c and 46d.

Each read-control FinFET 40 controlling the data-read is connected to the corresponding memory cells and the corresponding second bit line. In FIG. 3, two of the four reading control FinFETs 40 are connected to one second bit line 36 (BLB1) and respectively connected to the memory cells 46a and 46c; the other two read-control FinFETs 40 are connected to another second bit line 36 (BLB2) and respectively connected to the memory cells 46b and 46d.

Each read-control FinFET 40 has a first control gate 60 (such as the front gate), a second control gate 62 (such as the back gate), a drain 64 and a source 66. The first control gate 60 is connected to the first storage node 56 of the first inverter 48 to reduce leakage current, considering various topologies of data storage. The second control gate 62 is connected to the corresponding read-control line 38. For example, the second control gates 62 of the memory cells 46a and 46b are connected to one read-control line 38 (RWL1); the second control gates 62 of the memory cells 46c and 46d are connected to another read-control line 38 (RWL2). Each drain 64 is connected with the corresponding second bit line 36. For example, the drains 64 of the memory cells 46a and 46c are connected to one second bit line 36 (BLB1); the drains 64 of the memory cells 46b and 46d are connected to another second bit line 36 (BLB2).

Each read voltage control line 42 is connected to the source 66 of the corresponding read-control FinFET 40. When one memory cell is selected to be read, the read-control line 42 of the memory cell is connected to ground.

The keeper circuits are exemplified by two keeper circuits 44, which are respectively connected to two second bit lines 36 (BLB1 and BLB2). One keeper circuit 44 is connected to the memory cells 46a and 46c arranged in the same vertical column along the bit line (BLB1). The other keeper circuit 44 is connected to the memory cells 46b and 46d arranged in the same vertical column along the bit line (BLB2). The two keeper circuits 44 provide a keeping voltage when the second bit lines 36 are at a high-level voltage.

The SRAM of the present invention further comprises a plurality of write-bit select lines 68 and a plurality of write-control lines 70. In the embodiment of FIG. 3, the write-bit select lines 68 are exemplified by two write-bit select lines WBS1 and WBS2; the write-control lines 70 are exemplified by two write-control lines WL1 and WL2. WBS1 is connected to the memory cells 46a and 46c arranged in the same vertical column parallel to WBS1. WBS2 is connected with the memory cells 46b and 46d arranged in the same vertical column parallel to WBS2. The write-bit select lines 68 are used to determine whether to write data into the memory cell 46a, 46b, 46c or 46d or not. One memory cell is not selected unless the write-bit select line 68 and write-control line 70 thereof ((WBS1 and WL1) or ((WBS2 and WL2)) are turned on simultaneously.

The front gates of the first control FinFET 52 and the second control FinFET 54 of each memory cell are connected to one corresponding write control line 70. For example, the front gates of the first control FinFET 52 and the second control FinFET 54 of the memory cells 46a and 46b are connected with the write-control line WL1; the front gates of the first control FinFET 52 and the second control FinFET 54 of the memory cells 46c and 46d are connected to the write-control line WL2. The back gates of the first control FinFET 52 and the second control FinFET 54 of each memory cell are connected to one corresponding write-bit select line 68. For example, the back gates of the first control FinFET 52 and the second control FinFET 54 of the memory cells 46a and 46c are connected to the write-bit select line WBS1; the back gates of the first control FinFET 52 and the second control FinFET 54 of the memory cells 46b and 46d are connected to the write-bit select line WBS2.

The write-control line 70 (WL1), which connected to the memory cells 46a and 46b arranged in the horizontal row parallel to WL1, controls the data in the first bit line 34 (BL1/BL2) and second bit line (BLB1/BLB2) to be written into the corresponding memory cell 46a or 46b.

The connection of the abovementioned elements has been described hereinbefore. Below, described how the present invention promotes the read stability of the SRAM and how the present invention solves the leakage current problem by separating the paths of read current and write current.

Below, a read operation of the present invention is demonstrated. Firstly, simultaneously turn off two write-bit select lines 68 (WBS1 and WBS2) and two write-control lines 70 (WL1 and WL2). In the hold mode, the write-bit select lines 68 and the write-control lines 70 are at a low-level voltage. For example, pre-charge the first bit line (BL1) and the second bit line (BLB1) to a high-level voltage "1". When the memory cell 46a is selected to be read, the corresponding read-control line 38 (RWL1) provides a read-voltage to turn on the second control gates 62 of the read-control FinFETs 40 of the memory cell 46a and the memory cell 46b in the same horizontal row parallel to RWL1 and let the second control gates 62 be at a high-level voltage. Meanwhile, the sources 66 of the read-control FinFETs 40 of the memory cell 46a and the memory cell 46b in the same horizontal row are connected to ground by the corresponding read voltage control lines 42. If the first storage node (VL) is at "1", the first control gate 60 of the read-control FinFET 40 is turned on. Thus, the second bit line 36 (BLB1) is discharged successfully.

If the first storage node (VL) is at "0", the first control gate 60 of the reading control FinFET 40 is turned off. Thus, the second bit line 36 (BLB1) is maintained at a high-level voltage. Therefore, whether the stored data is "0" or "1" can be recognized by various sensing technologies. When the second bit line 36 (BLB1) is at a high-level voltage, the keeper circuit 44 provides a keeping voltage to compensate the leakage current generated by the half-turned on read-control FinFET 40 (of the memory cell 46c in the same vertical column) and the voltage loss of the second bit line 36 (BLB1). Therefore, the read voltage control lines 42 and the keeper circuits 44 can effectively reduce the probability of falsely read. The read voltage control line 42 corresponding to the unselected memory cell 46c connects the source 66 of the readcontrol FinFET 40 to the voltage source, VDD, whereby reduced the leakage current problem.

Figure 1:
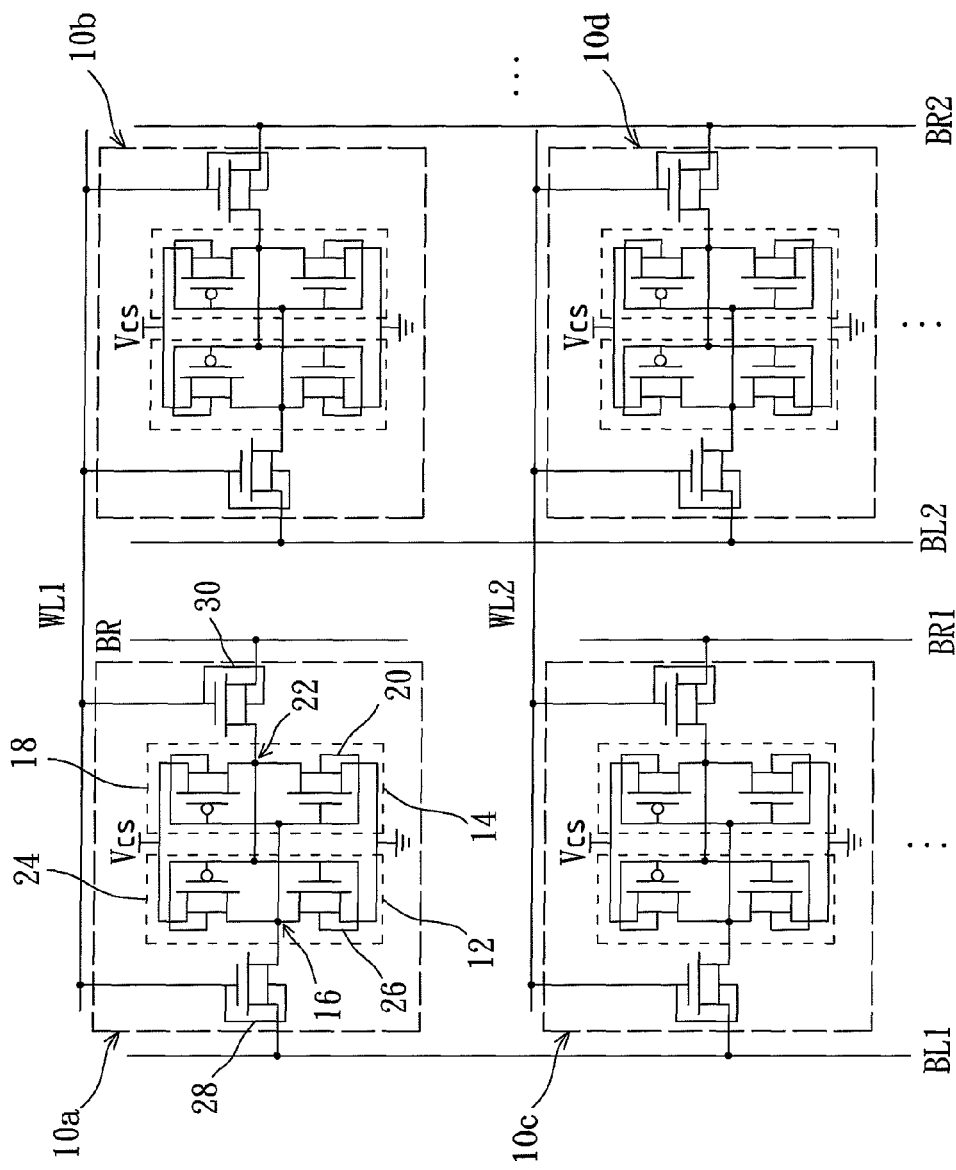
FIG. 1 schematically shows a conventional 6T SRAM.
Figure 2:
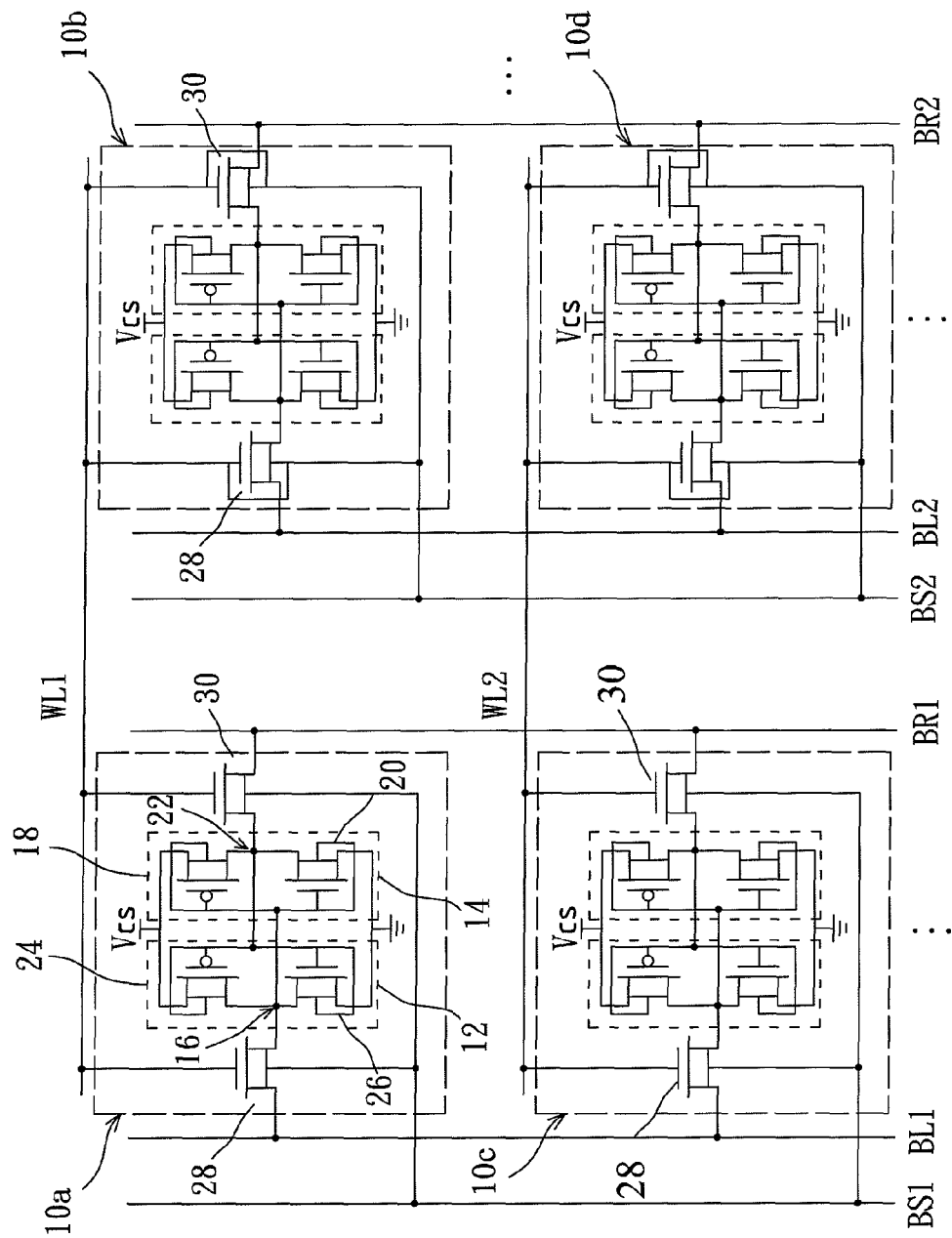
FIG. 2 schematically shows a 6T-column-decoupled SRAM.
Figure 4:
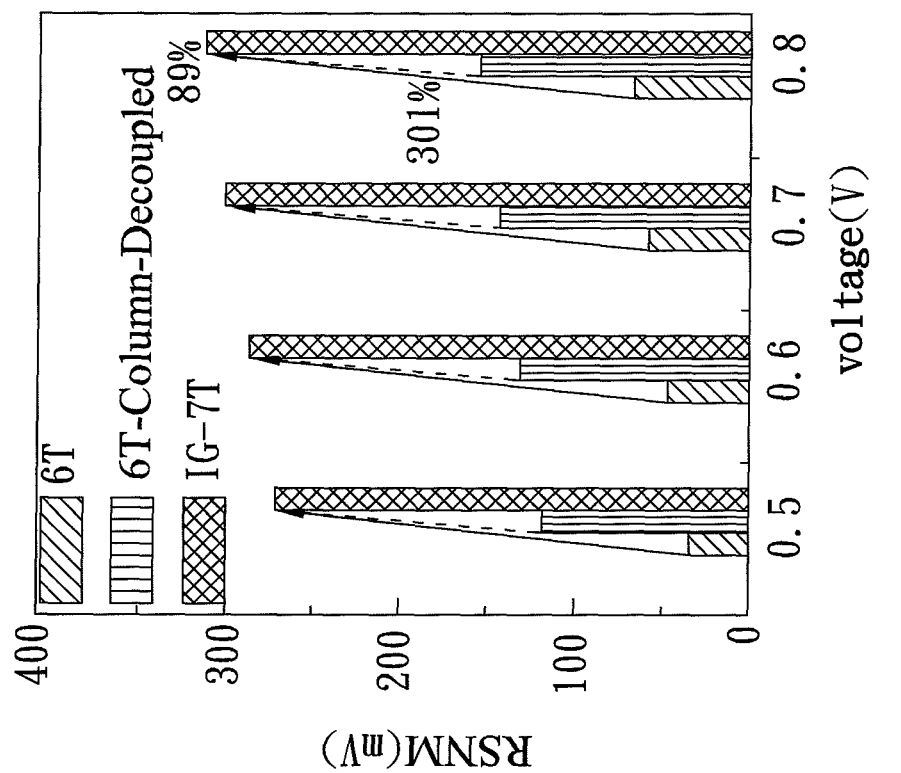
FIG. 4 shows the relationship of RSNM and the operation voltage.

Below, the IG-7T SRAM of the present invention is compared with the conventional 6T SRAM (in FIG. 1) and the 6T-column-decoulped SRAM (in FIG. 2). Refer to FIG. 4, it shows the RSNM at various operation voltages (ranging from 0.5V to 0.8V). At an operation voltage VDD of 0.5V, RSNM of the read disturb-free SRAM of the present invention is higher than that of the conventional 6T SRAM and the 6T-column-depouled SRAM by 132 mV and 70 mV, respectively. Therefore, the present invention can improve the read stability by 307% in comparison with the conventional 6T SRAM in the case of VDD=0.5V. In the case of VDD=0.7V, the present invention can improve RSNM by 258% and 80% compared with the conventional 6T SRAM and the 6T-column-decoupled SRAM, respectively. Therefore, the present invention is much superior to the conventional SRAM in read stability.

Below, a write operation of the present invention is demonstrated. First, simultaneously turn off two read-control lines 38 (RWL1 and RWL2). When the memory cell 46a is selected to be written, the write-bit select line 68 (WBS1) is at a high-level voltage and turns on the back gates of the first control FinFET 52 and the second control FinFET 54. Assume that the first storage node 56 is "0" and that the second storage node 58 is "1", then the first bit line 34 (BL1) is charged to a high-level voltage, and the second bit line 36 (BLB1) is connected to ground. At this time, the write-control line 70 (WL1) turns on the front gates of the first control FinFET 52 and the second control FinFET 54. As both the write-bit select line 68 (WBS1) and the write-control line 70 (WL1) are at a high-level voltage, the data of first bit line 34 (BL1) and the second bit line 36 (BLB1) is written into the corresponding memory cell 46a. If it is intended to write "1" into the first storage node 56 and write "0" into the second storage node 58, undertake the operations similar to those described above can successfully write data into the storage nodes. If it is intended to keep the data in the memory cell 46a, the data will be preserved via the cross-coupled pair of the first inverter and second inverter of the memory cell 46a. When the memory cell 46b, 46c, or 46d is selected, it is operated similarly according to the principle of operating the selected memory cell 46a.

In conclusion, the present invention separates the read circuit path from the write current path to achieve superior read stability. Further, the present invention uses independently-controlled-gate FinFETs to effectively simplify the layout of the SRAM circuit and greatly reduce the size of SRAM. Therefore, the present invention can be used to fabricate higher-density SRAMs, promote the stability of SRAM, and increase the immunity against the process and intrinsic device variations.

The embodiments described above are only to exemplify the present invention but not to limit the scope of the present invention. Any equivalent modification or variation according to the spirit or characteristics of the present invention is to be also included within the scope of the present invention.

What is claimed is:

1. A static random access memory comprising
   a memory cell array storing at least one piece of data and including a plurality of memory cells each containing a first inverter, a second inverter, a first control FinFET (Fin-based Field Effect Transistor) and a second control FinFET, wherein said first inverter and said second inverter are cross coupled to each other, and wherein said first control FinFET is connected to said first inverter, and wherein said second control FinFET is connected to said second inverter;
   a plurality of first bit lines and second bit lines, wherein each said first bit line is connected to said first control FinFETs, and wherein each said second bit line is connected to said second control FinFETs;
   a plurality of read-control lines each supplying a read voltage and each connected to said memory cells arranged in an identical horizontal row parallel to said read-control line;
   a plurality of read-control FinFETs each connected to all said memory cells and all said second bit lines and controlling the read data, wherein each said read-control FinFET includes
      a first control gate connected to a first storage node of said first inverter;
      a second control gate connected to one said read-control line corresponding thereto;
      a drain connected to said second bit line; and
      a source;
   a plurality of read voltage control lines each connected to said source and determining voltages of that said memory cells are connected to; and
   a plurality of keeper circuits supplying a keeping voltage when said second bit line is at a high-level voltage, and each connected to said memory cells arranged along an identical vertical column along the bit line direction.

2. The static random access memory according to claim 1, wherein said read-control FinFET is turned on when said first gate of control FinFET and said second gate of control FinFET are at a high-level voltage.

3. The static random access memory according to claim 1, wherein said read-control FinFET is half turned on when said first control gate or said second control gate is at a high-level voltage.

4. The static random access memory according to claim 1, wherein when one said memory cell is selected to be read, one said read-voltage control line of said memory cells, which are arranged in an identical horizontal row where said memory cell selected to be read, is connected to ground.

5. The static random access memory according to claim 1, wherein when said memory cells are not selected to be read, said read-voltage control lines are connected to a voltage of a voltage source.

6. The static random access memory according to claim 1, wherein said keeping voltage is to compensate the leakage current and voltage loss occurring when said read-control FinFET is half turned on.

7. The static random access memory according to claim 1 further comprising
   a plurality of write-bit select lines each connected to said memory cells arranged in an identical vertical column parallel to said write-bit select line, and determining whether data is to be written into said memory cells or not; and
   a plurality of write-control lines each connected to said memory cells arranged in an identical horizontal row parallel to said write-control line, and controlling data of said first bit line and said second bit line to be written into one corresponding said memory cell.

8. The static random access memory according to claim 7, wherein when at least one of said write-bit select line and said write-control line is at a high-level voltage, data of said first bit line and said second bit line is written into one corresponding said memory cell.

9. The static random access memory according to claim 7, wherein front gates of said first control FinFET and said second control FinFET of each said memory cell are connected to every said write-control line, and wherein back gates of said first control FinFET and said second control FinFET of each said memory cell are connected to every said write-bit select line.

10. The static random access memory according to claim 7, wherein when said write-control lines and said read-control lines are turned off simultaneously, said memory cells preserve data thereinside.

* * * * *